United States Patent
Jeong

(10) Patent No.: US 9,006,776 B2
(45) Date of Patent: Apr. 14, 2015

(54) LIGHT EMITTING DEVICE AND LIGHT EMITTING DEVICE PACKAGE HAVING THE SAME

(71) Applicant: LG Innotek Co., Ltd., Seoul (KR)

(72) Inventor: Hwan Hee Jeong, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/513,821

(22) Filed: Oct. 14, 2014

(65) Prior Publication Data

US 2015/0054015 A1 Feb. 26, 2015

Related U.S. Application Data

(63) Continuation of application No. 13/567,446, filed on Aug. 6, 2012, now Pat. No. 8,901,597, which is a continuation of application No. 13/023,229, filed on Feb. 8, 2011, now abandoned.

(30) Foreign Application Priority Data

Feb. 9, 2010 (KR) ........................ 10-2010-0011812

(51) Int. Cl.
*H01L 33/62* (2010.01)
*H01L 33/54* (2010.01)
*H01L 33/12* (2010.01)
*H01L 33/40* (2010.01)

(52) U.S. Cl.
CPC ................ *H01L 33/54* (2013.01); *H01L 33/12* (2013.01); *H01L 33/405* (2013.01)

(58) Field of Classification Search
CPC ................. H01L 2924/00; H01L 2224/48091; H01L 2924/00014; H01L 2224/48247; H01L 33/32

USPC ............................................ 257/99, E33.059
See application file for complete search history.

(56) References Cited

U.S. PATENT DOCUMENTS

| 7,659,553 | B2 | 2/2010 | Kato et al. |
| 2003/0141506 | A1 | 7/2003 | Sano et al. |
| 2007/0290215 | A1 | 12/2007 | Kato et al. |
| 2009/0261370 | A1 | 10/2009 | Jeong |
| 2010/0065872 | A1 | 3/2010 | Lee |
| 2011/0168971 | A1 | 7/2011 | Song |

FOREIGN PATENT DOCUMENTS

| EP | 2 262 011 A2 | 12/2010 |
| JP | 2007-335793 A | 12/2007 |
| KR | 10-0872717 B1 | 12/2008 |
| KR | 10-2009-0104931 A | 10/2009 |
| KR | 10-2009-0111225 A | 10/2009 |
| WO | WO 2009/002040 A2 | 12/2008 |
| WO | WO 2009/078574 A1 | 6/2009 |
| WO | WO 2009/145465 A2 | 12/2009 |

*Primary Examiner* — Tony Tran
(74) *Attorney, Agent, or Firm* — Birch, Stewart, Kolasch & Birch, LLP

(57) ABSTRACT

Disclosed are a light emitting device. The light emitting device includes a light emitting structure including a first conductive semiconductor layer, a second conductive semiconductor layer, and an active layer, an electrode connected to the first conductive semiconductor layer. First to third conductive layers are disposed under the second conductive semiconductor layer. A protective layer is disposed outward further than the first conductive layer. A support member is disposed under the third conductive layer. A buffer layer is disposed between protective layer and the third conductive layer. The protective layer includes a first opening, a first portion, and a second portion. The second portion of the protective layer and the buffer layer is overlapped with the third conductive layer and is disposed outwardly further than a lateral surface of the first conductive layer.

19 Claims, 7 Drawing Sheets

LIGHT EMITTING DEVICE AND LIGHT EMITTING DEVICE PACKAGE HAVING THE SAME

This application is a Continuation of co-pending U.S. patent application Ser. No. 13/567,446 filed on Aug. 6, 2012, which is a continuation of U.S. patent application Ser. No. 13/023,229 (now abandoned) filed on Feb. 8, 2011, which claim priority under 35 U.S.C. §119(a) of Korean Patent Application No. 10-2010-0011812 filed on Feb. 9, 2010. All of the above applications are hereby expressly incorporated by reference into the present application.

BACKGROUND

The embodiment relates to a light emitting device and a light emitting device package having the same.

Groups III-V nitride semiconductors have been extensively used as main materials for light emitting devices, such as a light emitting diode (LED) or a laser diode (LD), due to the physical and chemical characteristics thereof. In general, the groups III-V nitride semiconductors include a semiconductor material having a compound formula of $In_xAl_yGa_{1-x-y}N$ ($0 \leq x \leq 1$, $0 \leq y \leq 1$, and $0 \leq x+y \leq 1$).

The LED is a semiconductor device, which transmits/receives signals by converting an electric signal into infrared ray or light using the characteristics of compound semiconductors. The LED is also used as a light source.

The LED or the LD using the nitride semiconductor material is mainly used for the light emitting device to provide the light. For instance, the LED or the LD is used as a light source for various products, such as a keypad light emitting part of a cellular phone, an electric signboard, and an illumination device.

SUMMARY

The embodiment provides a light emitting device including a buffer layer to protect a protective layer and a light emitting package having the same.

The embodiment provides a light emitting device including a buffer layer having superior adhesive strength with a protective layer, which includes an oxide, in a channel region of a light emitting structure, and a light emitting package having the same.

According to an embodiment, the light emitting device includes a light emitting structure including a first conductive semiconductor layer, a second conductive semiconductor layer under the first conductive semiconductor layer, and an active layer between the first and second conductive semiconductor layers; an electrode disposed on the first conductive semiconductor layer; an electrode layer under the second conductive semiconductor layer; a conductive support member under the electrode layer; a protective layer disposed on an outer portion of a lower surface of the second conductive semiconductor layer; and a buffer layer disposed on at least one of top and lower surfaces of the protective layer, wherein the conductive support member includes a top surface having a width wider that of the lower surface of the second conductive semiconductor layer, wherein the protective layer includes a first portion between the second conductive semiconductor layer and the conductive support member and a second portion extended outwardly beyond a lower surface of the second conductive semiconductor layer, wherein the buffer layer includes a different material from the protective layer.

According to an embodiment, the light emitting device includes a light emitting structure including a first conductive semiconductor layer, a second conductive semiconductor layer under the first conductive semiconductor layer, and an active layer between the first and second conductive semiconductor layers; an electrode disposed on the first conductive semiconductor layer; an electrode layer including a plurality of conductive layers under the second conductive semiconductor layer; a conductive support member under the electrode layer; a protective layer disposed on an outer portion of a lower surface of the second conductive semiconductor layer; and a buffer layer disposed on a lower surfaces of the protective layer, wherein the conductive support member includes a top surface having a width wider that of the lower surface of the second conductive semiconductor layer, wherein the protective layer includes a first portion between the second conductive semiconductor layer and the conductive support member and a second portion extended outwardly beyond a lower surface of the second conductive semiconductor layer, wherein the buffer layer includes a conductive material and is physically contacted with the second portion of the protective layer.

According to an embodiment, the light emitting device package includes a body, a plurality of lead electrodes on the body, a light emitting device provided on at least one of the lead electrodes and electrically connected to the lead electrodes, and a molding member on the light emitting device. The light emitting device includes a light emitting structure including a first conductive semiconductor layer, a second conductive semiconductor layer, and an active layer between the first conductive semiconductor layer and the second conductive semiconductor layer, an electrode electrically connected to the first conductive semiconductor layer, a reflective layer under the second conductive semiconductor layer, a protective layer disposed around a lower surface of the second conductive semiconductor layer, and a buffer layer disposed on at least one of top and lower surfaces of the protective layer.

DETAILED DESCRIPTION OF THE EMBODIMENTS

Figure 1:
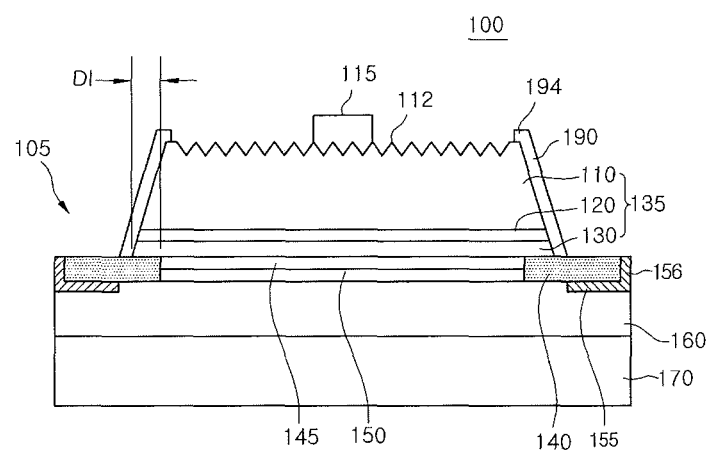
FIG. 1 is a side sectional view showing a light emitting device according to a first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

FIG. 1 is a side sectional view showing a light emitting device 100 according to a first embodiment.

Referring to FIG. 1, the light emitting device 100 includes a light emitting structure 135 having a plurality of compound semiconductor layers 110, 120, and 130, a protective layer 140, an ohmic layer 145, a reflective layer 150, a buffer layer 155, an adhesion layer 160, a conductive support member 170, and an insulating layer 190.

The light emitting device 100 may include a light emitting diode (LED) including compound semiconductors of group III-V elements. The groups III-V nitride semiconductors include a semiconductor material having a compound formula of $In_xAl_yGa_{1-x-y}N$ ($0 \leq x \leq 1$, $0 \leq y \leq 1$, and $0 \leq x+y \leq 1$). The LED may be an LED in a visible ray band of emitting blue, green, or red light, or an UV LED, but the LED may be variously realized with the technical scope of the embodiment.

The light emitting structure includes the first conductive semiconductor layer 110, the active layer 120, and the second conductive semiconductor layer 130.

The first conductive semiconductor layer 110 may include one selected from the group consisting of GaN, AlN, AlGaN, InGaN, InN, InAlGaN, AlInN, AlGaAs, GaP, GaAs, GaAsP, and AlGaInP, which are compound semiconductors of group III-V elements doped with first conductive dopants. When the first conductive semiconductor layer 110 is an N-type semiconductor, the first conductive dopant includes an N-type dopant such as Si, Ge, Sn, Se, or Te. The first conductive semiconductor layer 110 may have a single layer structure or a multiple layer structure, but the embodiment is not limited thereto. The first conductive semiconductor layer 110 may be provided on a top surface thereof with a light extraction structure such as a roughness pattern 112 for the purpose of light extraction efficiency. For the purpose of current diffusion and light extraction, the first conductive semiconductor layer 110 may be provided on the top surface thereof with a transparent electrode layer or an insulating layer.

An electrode 115 may be formed on the first conductive semiconductor layer 110. The electrode 115 may include a pad or may include an electrode pattern having a branch structure connected with the pad, but the embodiment is not limited thereto. The electrode 115 may be provided on a top surface thereof with a roughness and/or pattern, but the embodiment is not limited thereto. The top surface of the first conductive semiconductor layer 110, on which the electrode 115 is formed, may be flat, but the embodiment is not limited thereto.

The electrode 115 may make ohmic contact with the top surface of the first conductive semiconductor layer 110. The electrode 115 may have a single layer structure or a multiple layer structure including at least one selected from the group consisting of Cr, Ti, Al, In, Ta, Pd, Co, Ni, Si, Ge, Ag, Cu, Au, and the mixture thereof. The electrode 115 may include the above material based on ohmic contact with the first conductive semiconductor layer 110, an adhesion property between metallic layers, a reflective property, and conductivity.

The active layer 120 is formed under the first conductive semiconductor layer 110. The active layer 120 may have a single quantum well structure, a multiple quantum well structure, a quantum wire structure, or a quantum dot structure. The active layer 120 may have a stack structure including a well layer and a barrier layer, which are made from compound semiconductors of group III-V elements. For example, the active layer 120 may have a stack structure of an InGaN well layer/GaN barrier layer, an InGaN well layer/AlGaN barrier layer, or an InGaN well layer/InGaN layer, but the embodiment is not limited thereto.

A conductive clad layer may be formed on and/or under the active layer 120. The conductive clad layer may include a nitride-based semiconductor. The barrier layer may have a band gap higher than that of the well layer, and the conductive clad layer may have a band gap higher than that of the barrier layer.

The second conductive semiconductor layer 130 is formed under the active layer 120. The second conductive semiconductor layer 130 includes the compound semiconductors of group III-V elements doped with the second conductive dopant. For instance, the second conductive semiconductor layer 130 may include at least one selected from the group consisting of GaN, AlN, AlGaN, InGaN, InN, InAlGaN, AlInN, AlGaAs, GaP, GaAs, GaAsP, and AlGaInP. If the second conductive semiconductor layer 130 is a P type semiconductor layer, the second conductive semiconductor layer 130 may be prepared as a single layer or a multiple layer, but the embodiment is not limited thereto.

The light emitting structure 135 may further include a third conductive semiconductor layer under the second conductive semiconductor layer 120. The third conductive semiconductor layer may have polarities opposite to those of the second conductive semiconductor layer 120. The first conductive semiconductor layer 110 may include a P-type semiconductor layer, and the second conductive semiconductor layer 130 may include an N-type semiconductor. Accordingly, the light emitting structure 135 may include at least one of an N-P junction structure, a P-N junction structure, an N-P-N junction structure, and a P-N-P junction structure.

The protective layer 140 and the electrode layer 150 are formed under the second conductive semiconductor layer 130 or the third conductive semiconductor layer. Hereinafter, for the purpose of explanation, the second conductive semiconductor layer 130 will serve as the lowest layer of the light emitting structure 135.

The protective layer 140 is provided at a channel region 105 which is an outer portion of a chip, and the channel region 105 becomes an outer peripheral portion of a chip corresponding to the boundary between chips. The protective layer 140 may be defined as a channel layer of the chip. An outer portion of a top surface of the protective layer 140 is exposed to an outside, or may be covered by another material, for example, the insulating layer 190. In addition, the protective layer 140 may be provided on a top surface thereof with a roughness and/or a pattern, and the protective layer 140, and the roughness and/or the pattern of the protective layer 140 can improve light extraction efficiency in the channel region. The roughness or the pattern is formed at an outer portion of a top surface of the protective layer 140, and may include a material different from a material of the protective layer 140. The roughness or the pattern may include a material having a refractive index different from that of the protective layer 140. The roughness or the pattern may include compound semiconductors of group III-V elements. For example, the roughness or the pattern may include one selected from the group consisting of GaN, AlN, AlGaN, InGaN, InN, InAlGaN, AlInN, AlGaAs, GaP, GaAs, GaAsP, and AlGaInP. The roughness or pattern may be formed by using the second conductive semiconductor that may be formed through an isolation etching process.

An inner portion of the top surface of the protective layer 140 makes contact with an outer portion of a lower surface of the second conductive semiconductor layer 130 with a predetermined width D1. The width D1 is within a few micrometers (μm) or a few tens micrometers (μm). The width D1 may vary depending on a chip size.

The protective layer 140 may be formed in a loop shape, a ring shape, or a frame shape at an outer peripheral portion of the lower surface of the second conductive semiconductor layer 130. The protective layer 140 may have a continuous pattern shape or a discontinuous pattern shape.

The protective layer 140 may include a material such as a transmissive oxide, a transmissive nitride, or a transmissive insulating material and has a refractive index lower than that of compound semiconductors of group III-V elements. The protective layer 140 may include one selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $SiO_2$, $SiO_x$, $SiO_xN_y$, $Si_3N_4$, $Al_2O_3$, and $TiO_2$.

If the protective layer 140 includes $SiO_2$, the protective layer 140 may have the refractive index of about 2.3, and refractive indices of ITO and GaN are about 2.1 and about 2.4, respectively. Accordingly, light incident onto the protective layer 140 through the second conductive semiconductor layer 130 can be output to the outside. In this case, light extraction efficiency can be improved.

The protective layer 140 can prevent the light emitting structure 135 from being shorted even if the outer wall of the light emitting structure 135 is exposed to moisture, thereby enabling the LED to have superior property under the high moisture condition. If the protective layer 140 includes a transmissive material, when the laser scribing process is performed, the laser beam passes through the protective layer 140 so that metallic particles caused by the laser beam may not be generated from the channel region 105, thereby preventing interlayer short from occurring at the sidewall of the light emitting structure 135.

The protective layer 140 spaces the outer wall of each layer 110, 120, or 130 of the light emitting structure 135 apart from the reflective layer 150. The protective layer 140 may have a thickness of about 0.02 μm to about 5 μm, and the thickness may vary according to a chip size.

The buffer layer 155 is formed under the protective layer 140. The buffer layer 155 acts as a buffer against external shock imposed to the protective layer 140. The buffer layer 155 is disposed between the protective layer 140 and the adhesion layer 160, so that the adhesive strength of the protective layer 140 can be improved. The buffer layer 155 acts as an oxide buffer layer or a metallic layer for oxide adhesion. The buffer layer 155 may be defined as a channel buffer layer of chip.

The buffer layer 155 is formed at an entire portion of the lower surface of the protective layer 140 or a portion of the lower surface of the protective layer 140. An outer portion 156 of the buffer layer 155 may extend to an outer lateral surface of the protective layer 140. In other words, the buffer layer 155 may be provided under the protective layer 140 and at an outer lateral surface of the protective layer 140. The buffer layer 155 may have a thickness of about 1 μm to 10 μm. The buffer layer 155 may have a width of about 1 nm to about 100 μm. The buffer layer 155 may have various widths according to an isolation etching width.

The buffer layer 155 may improve adhesive strength related to the protective layer 140 in the channel region 105. The buffer layer 155 may include one selected from the group consisting of Ti, Ni, W, Pt, Pd, Cu, Mo, In, Sn, and alloy thereof, which are metallic materials having superior adhesive strength with an oxide, in a single layer structure or a multiple layer structure.

The outer portion 156 of the buffer layer 155 may fully or partially the outer portion of the protective layer 140. The outer portion 156 of the buffer layer 155 may extend to the lower surface of the second conductive semiconductor layer 130.

The ohmic layer 145 may include a material to change resistance like a current blocking layer, and may be provided in the form of a layer or a pattern. The ohmic layer 145 is formed between the second conductive semiconductor layer 130 of the light emitting structure 135 and the reflective layer 150. The ohmic layer 145 may include one selected from the group consisting of ITO, IZO, IZTO, IAZO, IGZO, IGTO, AZO, ATO, and GZO which are conductive oxide-based materials, and may make ohmic contact through the above material. The ohmic layer 145 may have at least one pattern and may include one selected from the group consisting of $SiO_2$, $SiO_x$, $SiO_xN_y$, $Si_3N_4$, $Al_2O_3$, and $TiO_2$. The reflective layer 150 may make contact with the second conductive semiconductor layer 130 in a region between the patterns of the ohmic layer 145.

The ohmic layer 145 may be formed by performing a sputtering scheme (e.g., radio-frequency-magnetron sputtering) or a deposition scheme with respect to the lower surface of the second conductive semiconductor layer 130, but the embodiment is not limited thereto. The thickness of the ohmic layer 145 may vary according to a current blocking layer, but the embodiment is not limited thereto.

The ohmic layer 145 makes contact with a lower portion of the second conductive semiconductor layer 130 to supply current applied through the reflective layer 150 to the second conductive semiconductor layer 130 or change a current path.

The reflective layer 150 may be provided inward from the lower surface of the ohmic layer 145 or the second conductive semiconductor layer 130.

The reflective layer 150 may be provided under the ohmic layer 145, and may include reflective metal. The reflective layer 150 may include seed metal, and the seed metal is used for a plating process. Accordingly, the reflective layer 150 may include an ohmic layer, a seed layer, or a reflective layer, but the embodiment is not limited thereto.

The reflective layer 150 may cover a portion of a lower surface of the protective layer 140. The portion of the lower surface of the protective layer 140 may correspond to about 80% or less of the width of the protective layer 140.

The reflective layer 150 may include one selected from the group consisting of Ag, Ni, Al, Rh, Pd, Ir, Ru, Mg, Zn, Pt, Au, Hf, and the combination thereof in a single layer structure or a multiple layer structure. The reflective layer 150 may selectively include the above materials and conductive oxide materials such as IZO, IZTO, IAZO, IGZO, IGTO, AZO, and ATO in a multiple structure. For example, the reflective layer 150 may have a stack structure of IZO/Ni, AZO/Ag, IZO/Ag/Ni, or AZO/Ag/Ni.

The adhesion layer 160 may be formed under the reflective layer 150 and the buffer layer 155. The adhesion layer 160 may make contact with a lower surface of the protective layer 140. The contact area may vary according to the reflective layer 150 or the buffer layer 155, but the embodiment is not limited thereto. The adhesion layer 160 includes barrier metal or bonding metal. For example, the adhesion layer 160 may include at least one selected from the group consisting of Ti, Au, Sn, Ni, Cr, Ga, In, Bi, Cu, Ag and Ta.

The adhesion layer 160 may serve as a bonding layer, and is bonded with the conductive support member 170 provided under the adhesion layer 160. The conductive support member 170 can be plated on the reflective layer 150 or attached to the reflective layer 150 in the form of a sheet without using the adhesion layer 160.

The conductive support member 170 is formed under the adhesion layer 160, and serves as a base substrate. The conductive support member 170 may include copper (Cu), gold (Au), nickel (Ni), molybdenum (Mo), copper-tungsten (Cu—W), or a carrier wafer such as Si, Ge, GaAs, ZnO, SiC, SiGe, or GaN. The conductive support member 170 may not be formed, or may be prepared in the form of a conductive sheet.

An outer surface of the light emitting structure 135 may be inclined, and an insulating layer 190 may be formed on the outer surface of the light emitting structure 135. A lower end of the insulating layer 190 may make partially contact with a top surface of the protective layer 140, or may fully cover the top surface of the protective layer 140. An upper end 194 of the insulating layer 190 may be formed around the first conductive semiconductor layer 110. Accordingly, the insulating layer 190 makes contact with the protective layer 140, and is formed around the light emitting structure 135, so that interlayer short can be prevented from occurring at the outer surface of the light emitting structure 135. The insulating layer 190 may include a material, such as $SiO_2$, $SiO_x$, $SiO_xN_y$, $Si_3N_4$, $Al_2O_3$, or $TiO_2$, having a refractive index lower than a refractive index (GaN: about 2.4) of the compound semiconductor.

FIGS. 2 to 9 are sectional views showing a method of manufacturing the light emitting device of FIG. 1.

Figure 2:
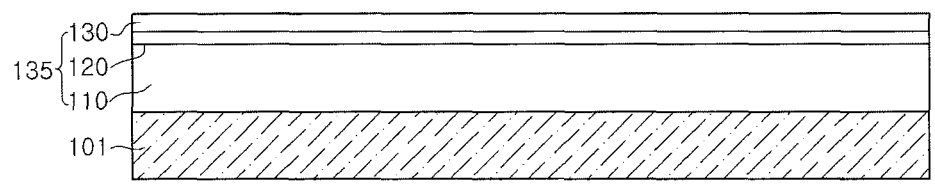
FIGS. 2 to 9 are view showing a method of manufacturing the light emitting device of FIG. 1.
Figure 3:
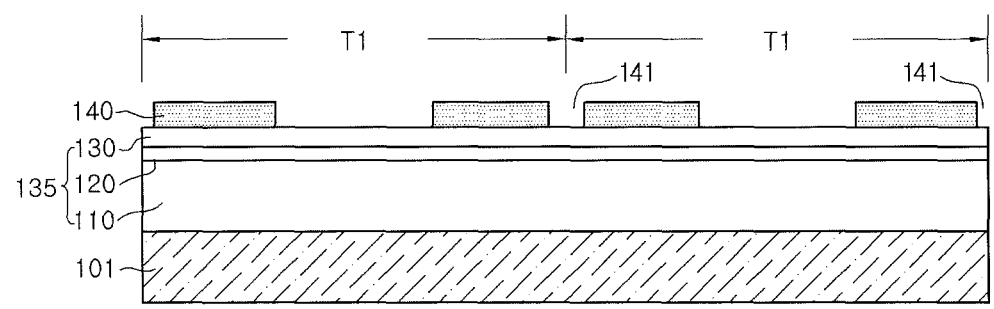

Referring to FIGS. 2 and 3, a substrate 101 is loaded into growth equipment and compound semiconductors of group II to VI elements are formed on the substrate 101 in the form of a layer or a pattern.

The growth equipment may be selected from the group consisting of E-beam evaporator, PVD (physical vapor deposition), CVD (chemical vapor deposition), PLD (plasma laser deposition), dual-type thermal evaporator, sputtering, and MOCVD (metal organic chemical vapor deposition). However, the embodiment is not limited to the above growth equipment.

The substrate 101 may include one selected from the group consisting of $Al_2O_3$, GaN, SiC, ZnO, Si, GaP, InP, $Ga_2O_3$, conductive material and GaAs. A concave-convex pattern can be formed on the top surface of the substrate 101. The substrate 101 is provided thereon with a layer or a pattern including compound semiconductors of group II to VI elements. For example, the substrate 101 may include at least one of a ZnO layer (not shown), a buffer layer (not shown), and an undoped semiconductor layer (not shown). The buffer layer and the undoped semiconductor layer may include a compound semiconductor of group III-V elements. The buffer layer reduces a lattice constant difference from the substrate 101, and the undoped semiconductor layer may include an undoped GaN-based semiconductor layer.

The first conductive semiconductor layer 110 is formed on the substrate 101, and the active layer 120 is formed on the first conductive semiconductor layer 110. The second conductive semiconductor layer 130 is formed on the active layer 120.

The first conductive semiconductor layer 110 may include one selected from the group consisting of GaN, AlN, AlGaN, InGaN, InN, InAlGaN, AlInN, AlGaAs, GaP, GaAs, GaAsP, and AlGaInP, which are compound semiconductors of III-V group elements doped with a first conductive dopant. When the first conductive semiconductor layer 110 is an N type semiconductor layer, the first conductive dopant includes an N type dopant such as Si, Ge, Sn, Se or Te. The first conductive semiconductor layer 110 may have a single layer or a multilayer, but the embodiment is not limited thereto.

The active layer 120 is formed on the first conductive semiconductor layer 110. The active layer 120 may have a single quantum well structure, a multiple quantum well structure, a quantum wire structure, or a quantum dot structure. The active layer 120 may have a stack structure including a well layer and a barrier layer, which are made from compound semiconductors of group III-V elements. For example, the active layer 120 may have a stack structure of an InGaN well layer/GaN barrier layer, an InGaN well layer/AlGaN barrier layer, or an InGaN well layer/InGaN barrier layer, but the embodiment is not limited thereto.

A conductive clad layer may be formed on and/or under the active layer 120. The conductive clad layer may include an AlGaN-based semiconductor.

The second conductive semiconductor layer 130 is formed on the active layer 120. The second conductive semiconductor layer 130 includes the group III-V compound semiconductor doped with the second conductive dopant. For instance, the second conductive semiconductor layer 130 may include at least one selected from the group consisting GaN, AlN, AlGaN, InGaN, InN, InAlGaN, AlInN, AlGaAs, GaP, GaAs, GaAsP, and AlGaInP. If the second conductive semiconductor layer 130 is a P type semiconductor layer, the second conductive dopant includes the P type dopant such as Mg or Ze. The second conductive semiconductor layer 130 can be prepared as a single layer or a multiple layer, but the embodiment is not limited thereto.

The first conductive semiconductor layer 110, the active layer 120, and the second conductive semiconductor layer 130 may be defined as the light emitting structure 135. In addition, the second conductive semiconductor 130 is provided thereon with the third conductive semiconductor, for example, an N-type semiconductor having polarities opposite to those of a second conductive type. Thus, the light emitting structure 135 may include at least one of an N-P junction structure, a P-N junction structure, an N-P-N junction structure, and a P-N-P junction structure.

Figure 4:
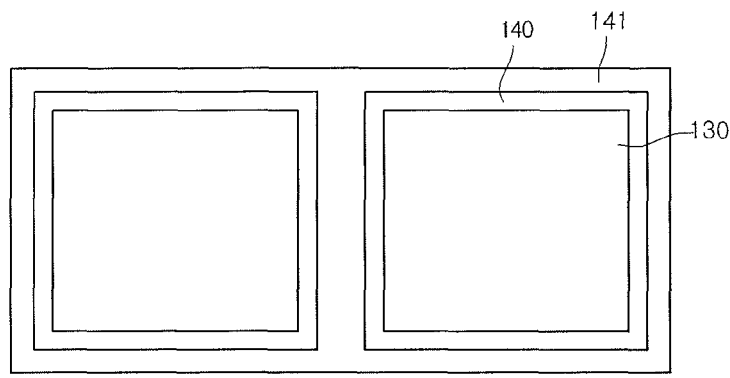

Referring to FIGS. 3 and 4, the protective layer 140 is formed at a channel region corresponding to the boundary of an individual chip having a size T1. The protective layer 140 is formed around the individual chip region by using a mask pattern. The protective layer 140 may have a continuous pattern or a discontinuous pattern having a ring shape, a band shape, or a frame shape. The protective layer 140 may include a material (e.g., an oxide, a nitride, or an insulating material) having a refractive index lower than that of compound semiconductors of group III-V elements. The protective layer 140 may include one selected from the group consisting of ITO, IZO, IZTO, IAZO, IGZO, IGTO, AZO, ATO, GZO, $SiO_2$, $SiO_x$, $SiO_xN_y$, $Si_3N_4$, $Al_2O_3$, and $TiO_2$. The protective layer 140 is subject to patterning and masking by using a mask through a lithography process. The protective layer 140 may be formed through a sputtering scheme or a deposition scheme using the above materials. If the protective layer 140 is a conductive oxide, the protective layer 140 may serve as a current diffusion layer or a current injection layer.

Within one chip size T1, an inner portion of the lower surface of the protective layer 140 may make contact with an outer portion of the top surface of the second conductive semiconductor layer 130 with a predetermined width. In this case, the width is in the range of a few micrometers (μm) (e.g., 1 μm or more) to a few tens micrometers (μm) (e.g., 90 μm or less), and may vary according to a chip size.

An opening section 141 is formed at the center of a region between the protective layers 140 of two adjacent chips, that is, at the center of a region between the two chips, and is open along the protective layer 140. Through the opening section 141, the compound semiconductor layer, for example, the second conductive semiconductor layer 130 or the third conductive semiconductor layer may be exposed. Hereinafter, according to the embodiment, the second conductive semiconductor layer 130 will be described as the highest layer of the light emitting structure 135.

Figure 5:
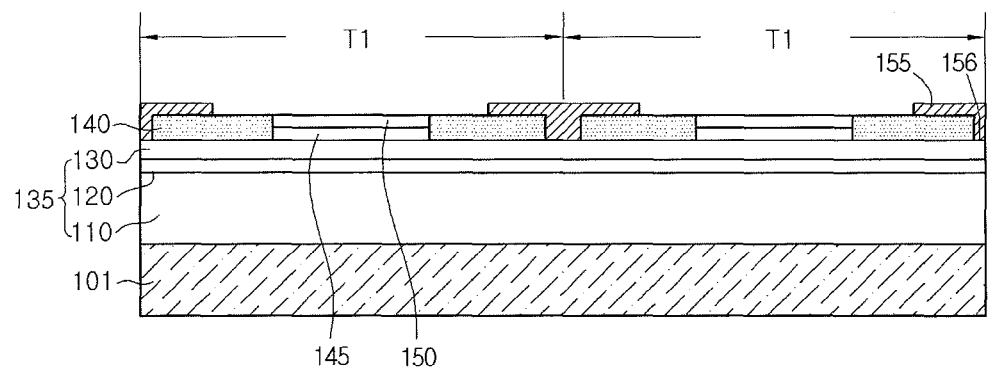
Figure 6:
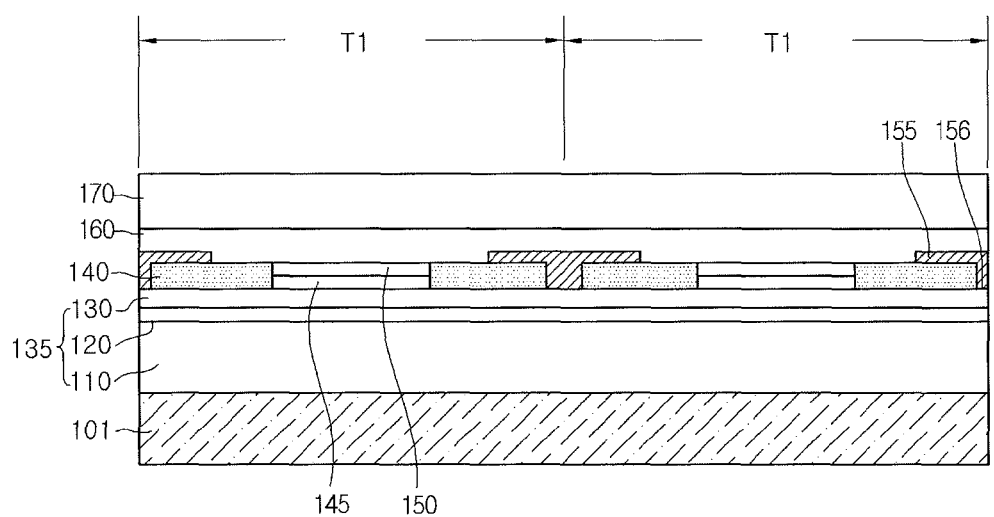

Referring to FIGS. 5 and 6, the buffer layer 155 is formed on the protective layer 140. The buffer layer 155 is formed at a channel region between two chips to make contact with the top surface of the second conductive semiconductor layer 130.

The buffer layer 155 may be formed by using a mask pattern through a sputtering scheme, a plating scheme or a deposition scheme. Hereinafter, a case in which the buffer layer 155 is formed through the sputtering scheme or the deposition scheme will be described. The buffer layer 155 is formed on the top surface and the outer lateral surface of the protective layer 140.

The buffer layer 155 is fully or partially formed on the top surface of the protective layer 140, and the outer portion 156 of the buffer layer 155 corresponding to a chip boundary may be formed along the outer lateral surface of the protective layer 140. The buffer layer 155 may cover an outer portion of the protective layer 140. The outer portion 156 of the buffer layer 155 makes contact with the second conductive semiconductor layer 130, so that the adhesive strength of the buffer layer 155 can be improved.

The buffer layer 155 is formed to improve an adhesive strength with the protective layer 140, and includes one selected from the group consisting of Ti, Ni, W, Pt, Pd, Cu, Mo, In, Sn, and alloy thereof which are metallic materials having superior adhesive strength with an oxide.

The ohmic layer 145 is formed on the second conductive semiconductor layer 130. The ohmic layer 145 may include a material to change resistance like a current blocking layer, and may be provided in the form of a layer or a pattern. The ohmic layer 145 is formed between the second conductive semiconductor layer 130 of the light emitting structure 135 and the reflective layer 150. The ohmic layer 145 may include one selected from the group consisting of ITO, IZO, IZTO, IAZO, IGZO, IGTO, AZO, ATO, and GZO which are conductive oxide-based materials, and may make ohmic contact through the above material. The ohmic layer 145 may have at least one pattern and may include one selected from the group consisting of $SiO_2$, $SiO_x$, $SiO_xN_y$, $Si_3N_4$, $Al_2O_3$, and $TiO_2$. If the ohmic layer 145 includes the same material as that of the protective layer 140, the ohmic layer 145 may be formed through the same process as that of the protective layer 140, but the embodiment is not limited thereto.

The ohmic layer 145 may be formed on the top surface of the second conductive semiconductor layer 130 through a sputtering scheme (e.g., radio-frequency-magnetron sputtering) or a deposition scheme, but the embodiment is not limited thereto. The thickness of the ohmic layer 145 may vary according to the current blocking layer, but the embodiment is not limited thereto.

The reflective layer 150 may be formed on the ohmic layer 145 such that the reflective layer 150 may cover the whole region of the ohmic layer 145. In addition, the reflective layer 150 may extend to the top surface of the protective layer 140 or the buffer layer 155, but the embodiment is not limited thereto.

The reflective layer 150 may include one selected from the group consisting of Ag, Ni, Al, Rh, Pd, Ir, Ru, Mg, Zn, Pt, Au, Hf, and combination thereof in a single layer structure or a multiple layer structure. The reflective layer 150 may have a multiple structure by using the above materials and conductive oxide materials such as IZO, IZTO, IAZO, IGZO, IGTO, AZO, and ATO. For example, the reflective layer 150 may have a stack structure of IZO/Ni, AZO/Ag, IZO/Ag/Ni, or AZO/Ag/Ni. The reflective layer 150 may be deposited through an E-beam (electron beam) scheme or may be formed through a sputtering scheme, but the embodiment is not limited thereto. If the reflective layer 150 includes the same material as that of the buffer layer 155, the reflective layer 150 may be formed through the same process as that of the buffer layer 155, but the embodiment is not limited thereto.

For example, the reflective layer 150 may have a stack structure of a first adhesion layer/reflective layer/second adhesion layer/seed layer. The first and second adhesion layers include Ni, the reflective layer includes Ag, and the seed layer includes Cu. The first adhesion layer may have a thickness of a few nanometers or less, and the reflective layer may have a thickness of a few hundreds nanometers or less. The second adhesion layer may have a thickness of a few tens nanometers, and the seed layer may have a thickness of 1 μm or less, but the embodiment is not limited thereto.

The reflective layer 150 may fully or partially cover the protective layer 140. Since the reflective layer 150 includes reflective metal, the reflective layer 150 may act as an electrode. The reflective layer 150 and metallic materials above the reflective layer 150 may act as an electrode.

Figure 7:
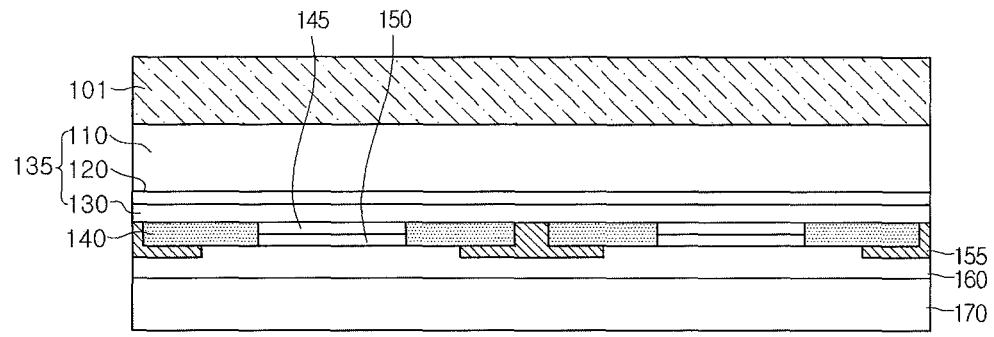

Referring to FIGS. 6 and 7, the adhesion layer 160 is formed on the reflective layer 150. The adhesion layer 160 may include barrier metal or bonding metal. For example, the adhesion layer 160 may include at least one selected from the group consisting of Ti, Au, Sn, Ni, Cr, Ga, In, Bi, Cu, Ag and Ta, but the embodiment is not limited thereto.

The adhesion layer 160 serves as a bonding layer, and may be bonded with the conductive support member 170 provided on the adhesion layer 160. The conductive support member 170 acts as a base substrate, and may include Cu, Ag, Ni, Mo, Cu—W, or a carrier wafer such as Si, Ge, GaAs, ZnO, SiC, SiGe, or GaN. The conductive support member 170 may be bonded with the adhesion layer 160, coated on the adhesion layer 160, or attached to the adhesion layer 160 in the form of a conductive sheet. According to the embodiment, the conductive support member 170 may be formed on the reflective layer 150 without the adhesion layer 160.

Figure 8:
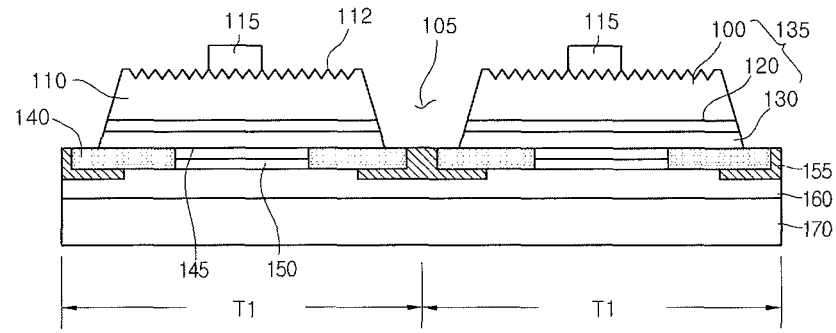

Referring to FIGS. 7 and 8, the conductive support member 170 is provided at a base. After the substrate 101 is provided on the light emitting structure 135, the substrate 101 is removed.

The substrate 101 may be removed through a laser lift off (LLO) process. According to the LLO process, a laser beam having a predetermined wavelength band is irradiated into the substrate 101 to separate the substrate 101. If another semiconductor layer (e.g., buffer layer) or an air gap exists between the substrate 101 and the first conductive semiconductor layer 110, the substrate 101 may be removed by using wet etchant. The substrate 101 may be removed through various schemes within the technical scope of the embodiment. Although the scheme of removing the substrate 101 has been described in the above embodiment, when a semiconductor layer having a specific refractive index is formed between the substrate 101 and the first conductive semiconductor layer 110, the substrate 101 can be separated from the semiconductor layer.

In addition, a portion of the buffer layer 155 makes contact with the first conductive semiconductor layer 110 through the protective layer 140, thereby preventing the delamination between the protective layer 140 and the adhesion layer 160 or between the protective layer 140 and the second conductive semiconductor layer 130 in the LLO process.

Figure 9:
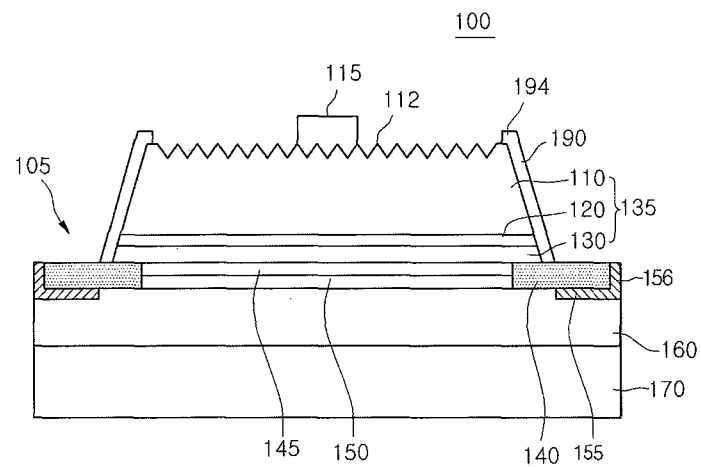

Referring to FIGS. 8 and 9, the light emitting structure between chips is removed through an isolation etching process to form the channel region 105. In other words, the isolation etching process is performed with respect to a boundary region between chips such that a portion of the protective layer 140 and the buffer layer 155 may be exposed at the channel region 105. The lateral surface of the light emitting structure 135 may be inclined or vertically formed.

When the protective layer 140 is a transparent material, the protective layer 140 allows a laser beam to pass therethrough in a laser scribing process or the isolation etching process, the metal materials such as the adhesion layer 160 and the conductive support member 170 can be prevented from protruding in the irradiation direction of the laser beam or from being broken.

The protective layer 140 allows the laser beam to passes therethrough to prevent metallic fragments from occurring in the channel region 105 due to the laser beam and to protect an outer wall of each layer of the light emitting structure 135.

When the isolation etching process is performed, the protective layer 140 is supported until the buffer layer 155 is exposed after the second conductive semiconductor layer 130 of the channel region 105 has been etched. In addition, since the adhesive strength between the protective layer 140, the buffer layer 155, and the adhesion layer 160 is increased by the buffer layer 155, the protective layer 140 can be prevented from being delaminated.

Then, an etching process is performed with respect to the top surface of the first conductive semiconductor layer 110 to form a roughness and/or a pattern 112. The roughness and/or the pattern 112 may improve light extraction efficiency.

The electrode 115 is formed on the first conductive semiconductor layer 110, and the electrode 115 may include a branch pattern having a predetermined shape and a pad.

The insulating layer 190 may be formed around the light emitting structure 135. The insulating layer 190 is formed around a chip. The lower end of the insulating layer 190 is formed on the protective layer 140, and the upper end 194 of the insulating layer 190 is formed around the top surface of the first conductive semiconductor layer 110. The insulating layer 190 is formed around the light emitting structure 135 to prevent short among the semiconductor layers 110, 120, and 130. The insulating layer 190 and the protective layer 140 can prevent moisture from being permeated into the chip. In addition, the insulating layer 190 may extend to the protective layer 140 or a portion of the buffer layer 155.

The insulating layer 190 may include an insulating material having a refractive index lower than that of the compound semiconductor (GaN has a refractive index of about 2.4). For example, the insulating layer 190 may include one selected from the group consisting of $SiO_2$, $SiO_x$, $SiO_xN_y$, $Si_3N_4$, $Al_2O_3$, and $TiO_2$.

The insulating layer 190 and the electrode 115 may be formed before or after a chip is separated, but the embodiment is not limited thereto.

In addition, individual chip units are formed by a chip boundary. In this case, the individual chip units may be formed through a cutting process, a laser process, or a breaking process. In this case, since the buffer layer 155 is provided at a boundary line between two adjacent chips, the adjacent two chips can be divided from each other about the buffer layer 155. In this case, the buffer layer 155 can reduce an influence exerted on the protective layer 140. In other words, the buffer layer 155 can prevent the protective layer 140 from being broken.

The buffer layer 155 may have a thickness of about 1 μm to about 10 μm, and may have a width of about 1 nm to about 100 μm. The width of the buffer layer 155 may vary according to an isolation etching width.

Figure 10:
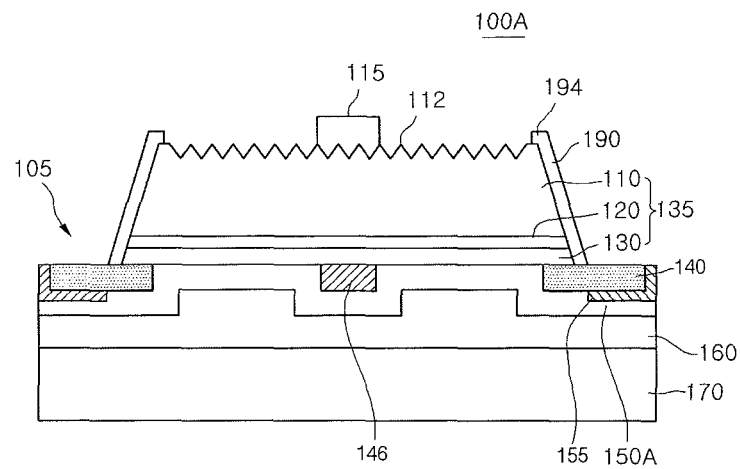
FIG. 10 is a side sectional view showing a light emitting device according to a second embodiment.

FIG. 10 is a side sectional view showing a light emitting device 100A according to a second embodiment. Hereinafter, the second embodiment will be described while focusing on the difference between the second embodiment and the first embodiment in order to avoid redundancy of explanation.

Referring to FIG. 10, the light emitting device 100A has a structure in which a reflective layer 150A makes contact with the lower portion of the second conductive semiconductor layer 130.

The reflective layer 150A may include an ohmic layer, and include one selected from the group consisting of Ag, Ni, Al, Rh, Pd, Ir, Ru, Mg, Zn, Pt, Au, Hf, and the combination thereof in a single layer structure or a multiple structure. The reflective layer 150A may be formed in a multiple layer by using the above metallic materials and conductive oxide materials such as IZO, IZTO, IAZO, IGZO, IGTO, AZO, and ATO. For example, the reflective layer 150A may have a stack structure of IZO/Ni, AZO/Ag, IZO/Ag/Ni, and AZO/Ag/Ni.

The reflective layer 150A may be formed beyond the protective layer 140 and the buffer layer 155.

A current blocking layer 146 is formed between the reflective layer 150A and the second conductive semiconductor layer 130, and the current blocking layer 146 may have a non-metallic material having conductivity lower than that of the reflective layer 150A. The current blocking layer 146 may include at least one of ITO, IZO, IZTO, IAZO, IGZO, IGTO, AZO, ATO, ZnO, $SiO_2$, $SiO_x$, $SiO_xN_y$, $Si_3N_4$, $Al_2O_3$, and $TiO_2$. In this case, when the reflective layer 150A includes Ag, the current blocking layer 146 may include ITO, ZnO, or SiO2, but the embodiment is not limited thereto.

The current blocking layer 146 may include the same material as that of the protective layer 140, or include a material different from that of the protective layer 140.

The current blocking layer 146 may have a position and a pattern facing to the electrode 115 with respect to a thickness direction of the light emitting structure 135, and the size of the current blocking layer 146 may vary according to current dispersion. The current blocking layer 146 may have a polygonal pattern or a circular pattern, and provided in a structure facing to the electrode 115 and/or a pad, so that current can be dispersed throughout the whole region of a chip. The current blocking layer 146 is formed under the light emitting structure 145 in such a manner that the current blocking layer 146 partially overlaps with the electrode 115 with respect to the thickness direction of the light emitting structure 135. The current blocking layer 146 may include a material having electrical conductivity lower than that of the reflective layer 150.

Figure 11:
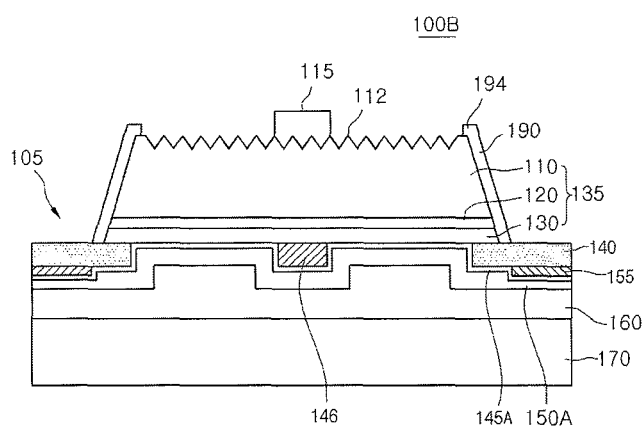
FIG. 11 is a side sectional view showing a light emitting device according to a third embodiment.

FIG. 11 is a side sectional view showing a light emitting device 100B according to a third embodiment. Hereinafter, the third embodiment will be described while focusing on the difference between the above embodiments and the third embodiment in order to avoid redundancy of explanation.

Referring to FIG. 11, the light emitting device 100B has a structure in which an ohmic layer 145A is provided under the current blocking layer 146 and the second conductive semiconductor layer 130. In addition, the ohmic layer 145A may be formed beyond the protective layer 140 and the buffer layer 155.

A reflective layer 150A may be formed under the ohmic layer 145A. The reflective layer 150A may fully or partially cover a lower surface of the ohmic layer 145A, but the embodiment is not limited thereto.

A portion of the buffer layer 155, which is exposed beyond the outer portion of the protective layer 140, may be removed through a wet etching process. In this case, the buffer layer 155 and the outer portion of the protective layer 140 may be provided on the same plane or formed in a stepped structure.

Figure 12:
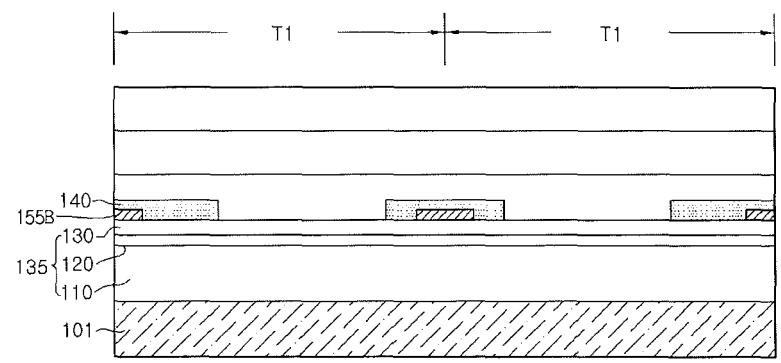
FIGS. 12 and 13 are view showing a method of manufacturing a light emitting device according to a fourth embodiment.
Figure 13:
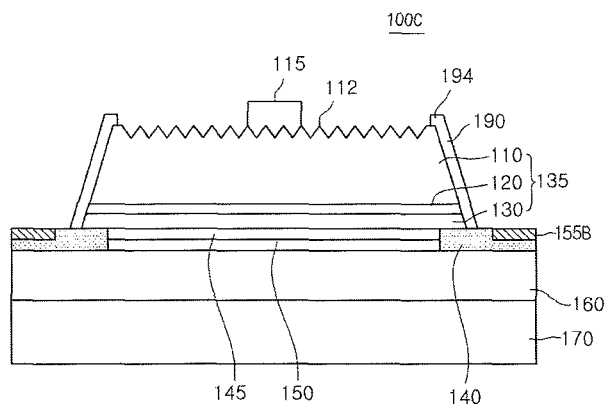

FIGS. 12 and 13 are side sectional views schematically showing a method of manufacturing a light emitting device according to a fourth embodiment. Hereinafter, the fourth embodiment will be described while focusing on the difference between the first embodiment and the fourth embodiment in order to avoid redundancy.

Referring to FIG. 12, the first conductive semiconductor layer 110, the active layer 120, and the second conductive semiconductor layer 130 are stacked on the substrate 101.

A buffer layer 155B is formed in the channel region on the second conductive semiconductor layer 130. The buffer layer 155B may be formed in a ring shape, a loop shape, or a frame shape by using a mask pattern through a sputtering scheme. The buffer layer 155B may include a material disclosed in the first embodiment. The buffer layer 155B may have a thickness thinner than that of the protective layer 140. The buffer layer 155B may have a thickness of about 1 µm to 10 µm.

The protective layer 140 is formed on the buffer layer 155B. The protective layer 140 is formed in a ring shape, a loop shape, or a frame shape while covering an outer portion of the buffer layer 155B. The protective layer 140 makes contact with an outer peripheral portion of a top surface of the second conductive semiconductor layer 130 in the channel region.

The buffer layer 155B is provided on the boundary line between chips, and provided between the protective layer 140 and the second conductive semiconductor layer 130. The protective layer 140 may have a thinner thickness. Accordingly, the buffer layer 155B buffers shock occurring in an LLO process, an isolation etching process, or a chip breaking process to prevent the shock from being transferred to the protective layer 140. Accordingly, the protective layer 140 can be prevented from being delaminated.

Referring to FIG. 13, in the light emitting device 100C, the buffer layer 155B remains on the protective layer 140 or may be removed through a wet etching process. When the buffer layer 155B has been removed, the protective layer 140 may have a stepped top surface.

Figure 14:
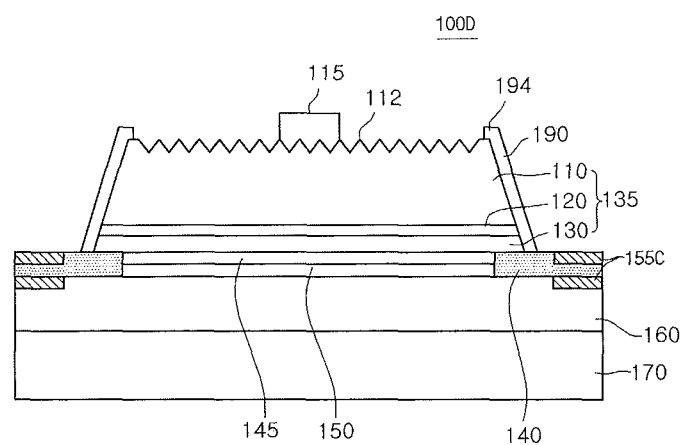
FIG. 14 is a side sectional view showing a light emitting device according to a fifth embodiment.

FIG. 14 is a side sectional view showing a light emitting device 100D according to a fifth embodiment. Hereinafter, the fifth embodiment will be described while focusing on the difference between the fifth embodiment and the above embodiment in order to avoid redundancy of explanation.

Referring to FIG. 14, in the light emitting device 100D, buffer layers 155C are provided on outer portions of top and lower surfaces of the protective layers 140, so that the protective layer 140 is prevented from being delaminated due to the shock in the channel region.

The buffer layers 155C provided on the top and lower surfaces of the protective layer 140 may be connected to each other through a chip boundary line or removed through a wet etching process. In this case, the adhesion efficiency of the protective layer 140 can be more improved due to the buffer layers 155C.

Figure 15:
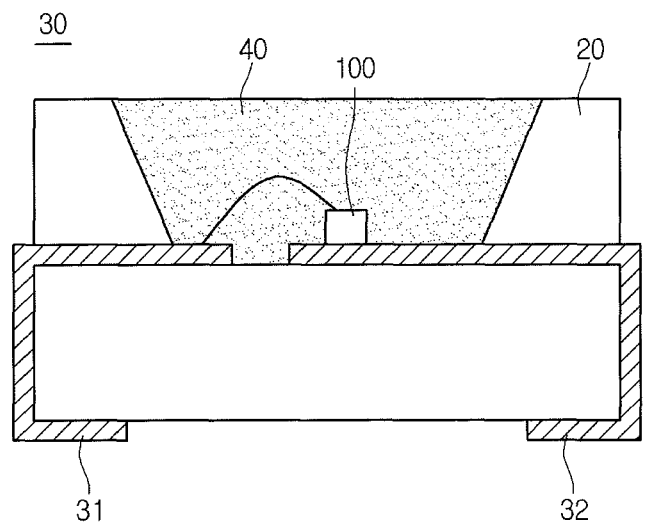
FIG. 15 is a side sectional view showing a light emitting device package according to the embodiment.

FIG. 15 is a sectional view showing a light emitting device package 30 according to the embodiment.

Referring to FIG. 15, the light emitting device package 30 includes a body 20, first and second lead electrodes 31 and 32 formed on the body 20, the light emitting device 100 according to the embodiment, which is installed in the body 20 and electrically connected to the first and second lead electrodes 31 and 32, and a molding member 40 surrounding the light emitting device 100.

The body 20 may include a conductive substrate including silicon, synthetic resin including PPA, a ceramic substrate, an insulating substrate, or a metallic substrate (e.g., MCPCB). An inclined surface may be formed around the light emitting device 100. The body 20 may include a through hole structure, but the embodiment is not limited thereto.

The first and second lead electrodes 31 and 32 are electrically insulated from each other and supply power to the light emitting device 100. The first and second lead electrodes 31 and 32 may reflect light emitted from the light emitting device 100 to increase light efficiency, and may discharge heat emitted from the light emitting device 100 to the outside.

The light emitting device 100 may be mounted on the body 20 or on the first and second lead electrodes 31 and 32.

The light emitting device 100 may be electrically connected with the first lead electrode 31 through a wire, and may be connected with the second lead electrode 32 through a die bonding scheme.

The molding member 40 may protect the light emitting device 100 while surrounding the light emitting device 100. In addition, the molding member 40 may include phosphors to change the wavelength of light emitted from the light emitting device 100. A lens may be provided on the molding member 40, and the lens may be realized in a contact structure or a non-contact structure with the molding member 40.

The light emitting device 100 may be electrically connected with the body 20 or a lower surface of a substrate via a through hole.

At least one of the above light emitting devices according to the embodiments may be mounted is the light emitting package, but the embodiment is not limited thereto.

Although the embodiment has been described in that the light emitting device package has a top view type, the light emitting device package may have a side view type. Accordingly, a heat sink characteristic, conductivity, and a reflectance characteristic can be improved. After such a top-view-type or side-view-type light emitting device is packaged in the resin layer, a lens may be formed on the resin layer or the lens may be bonded with the resin layer, but the embodiment is not limited thereto.

<Lighting System>

The light emitting devices and the light emitting device packages according to the embodiments may be applied to a light unit. The light unit may have an array structure including a plurality of light emitting devices or a plurality of light emitting device packages. The lighting system may include a display apparatus shown in FIGS. 16 and 17, a light unit shown in FIG. 18, in addition to a lighting lamp, a signal light, a vehicle headlight, an electronic display, etc.

Figure 16:
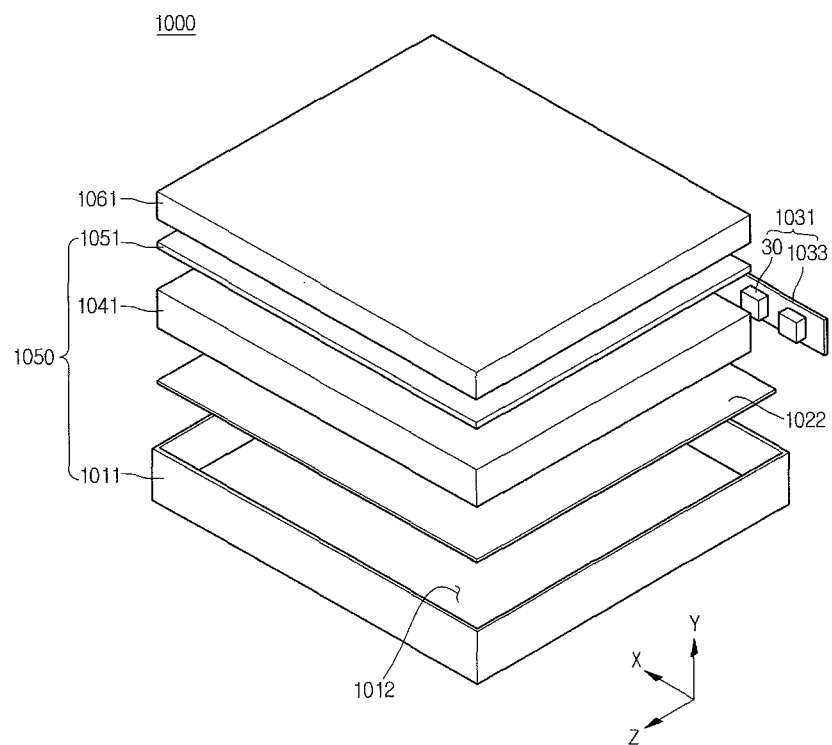
FIG. 16 is a disassembled perspective view of a display apparatus provided with the light emitting device.

FIG. 16 is a disassembled perspective view of a display apparatus according to an embodiment.

Referring to FIG. 116, the display apparatus 1000 according to the embodiment may include a light guide panel 1041, a light emitting module 1031 supplying light to the light guide panel 1041, a reflective member 1022 under the light guide panel 1041, an optical sheet 1051 on the light guide panel 1041, a display panel 1061 on the optical sheet 1051, and a bottom cover 1011 receiving the light guide panel 1041, the light emitting module 1031, and the reflective member 1022, but the present disclosure is not limited thereto.

The bottom cover 1011, the reflective sheet 1022, the light guide panel 1041, and the optical sheet may be defined as a light unit 1041.

The light guide panel 1041 functions to transform linear light to planar light by diffusing the linear light. The light guide panel 1041 may be made of a transparent material, and may include one of acryl-series resin such as polymethyl metaacrylate (PMMA), polyethylene terephthlate (PET), poly carbonate (PC), COC, and polyethylene naphthalate resin.

The light emitting module 1031 provides light to at least a side surface of the light guide panel 1041, and finally acts as a light source of a display apparatus.

The light emitting module 1031 may include at least one light emitting module, and provide light directly or indirectly from one side surface of the light guide panel 1041. The light emitting module 1031 may include a board 1033, and a light emitting device package 30 according to embodiments disclosed above, and the light emitting device packages 30 may be arranged apart by a predetermined interval from each other on the board 1033.

The board 1033 may be a printed circuit board (PCB) including a circuit pattern (not shown). The board 1033 may include a metal core PCB (MCPCB), a flexible PCB (FPCB), etc. as well as the general PCB, but the present disclosure is not limited thereto. In the case where the light emitting device package 30 is mounted on a side surface or a heat releasing plate, the board 1033 may be removed. Herein, some of the heat releasing plate may contact an upper surface of the bottom cover 1011.

The plurality of light emitting device packages 30 may be mounted on the board 1033 such that light emitting surfaces of the plurality of light emitting device packages 30 are spaced apart by a predetermined distance from the light guide panel 1041, but the present disclosure is not limited thereto. The light emitting device package 30 may supply light to a light incident part that is one side surface of the light guide panel 1041, directly or indirectly, but the present disclosure is not limited thereto.

The reflective member 1022 may be provided under the light guide panel 1041. The reflective member 1022 reflects light incident from a lower surface of the light guide panel 1041 to allow the reflected light to be directed toward an upper direction, thereby capable of enhancing brightness of the light unit 1050. The reflective member 1022 may be formed of, for example, PET, PC, PVC resin, or the like, but the present disclosure is not limited thereto.

The bottom cover 1011 may receive the light guide panel 1041, the light emitting module 1031, the reflective member 1022, and the like. For this purpose, the bottom cover 1011 may have a receiving part 1012 formed in a box shape a top surface of which is opened, but the present disclosure is not limited thereto. The bottom cover 1011 may be coupled to a top cover, but the present disclosure is not limited thereto.

The bottom cover 1011 may be formed of a metal material or resin material, and may be manufactured by using a process such as a press molding or an injection molding. Also, the bottom cover 1011 may include metallic or nonmetallic material having a high thermal conductivity, but the present disclosure is not limited thereto.

The display panel 1061 is, for example, an LCD panel, and includes first and second transparent substrates facing each other, and a liquid crystal layer interposed between the first and second substrates. A polarizing plate may be attached on at least one surface of the display panel 1061, but the present disclosure is not limited thereto. The display panel 1061 displays information by using light passing through the optical sheet 1051. The display apparatus 1000 may be applied to a variety of mobile terminals, monitors for notebook computers, monitors for lap-top computers, televisions, etc.

The optical sheet 1051 is disposed between the display panel 1061 and the light guide panel 1041, and includes at least one transparent sheet. The optical sheet 1051 may include, for example, at least one of a diffusion sheet, a horizontal and/or vertical prism sheet, and a brightness reinforcing sheet. The diffusion sheet diffuses incident light, the horizontal and/or vertical prism sheet focuses incident light on a display region, and the brightness reinforcing sheet enhances the brightness by reusing lost light. Also, a protective sheet may be disposed on the display panel 1061, but the present disclosure is not limited thereto. Herein, the display apparatus 1000 may include the light guide panel 1041, and the optical sheet 1051 as optical members positioned on a light path of the light emitting module 1031, but the present disclosure is not limited thereto.

Figure 17:
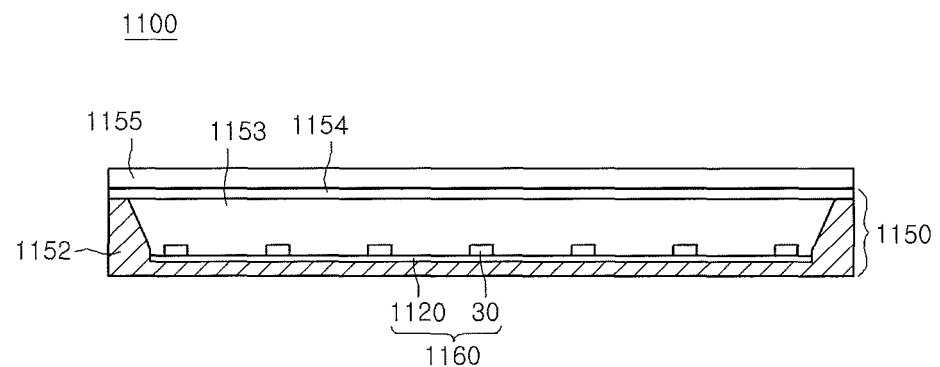
FIG. 17 is a schematic sectional view illustrating another example of a display apparatus provided with the light emitting device.

FIG. 17 is a cross-sectional view of a display apparatus according to an embodiment.

Referring to FIG. 17, the display apparatus 1100 includes a bottom cover 1152, a board 1120 on which the light emitting device packages 30 disclosed above are arrayed, an optical member 1154, and a display panel 1155.

The board 1120 and the light emitting device package 30 may be defined as a light emitting module 1060. The bottom cover 1152, the at least one light emitting module 1060, and the optical member 154 may be defined as a light unit.

The bottom cover 1152 may be provided with a receiving part, but the present disclosure is not limited thereto.

Herein, the optical member 1154 may include at least one of a lens, a light guide panel, a diffusion sheet, a horizontal and vertical prism sheet, and a brightness reinforcing sheet. The light guide panel may be formed of polycarbonate (PC) or poly methyl methacrylate (PMMA), and may be removed. The diffusion sheet diffuses incident light, the horizontal and vertical prism sheet focuses incident light on a display region, and the brightness reinforcing sheet enhances the brightness by reusing lost light.

The optical member 1154 is disposed on the light emitting module 1060. The optical member 154 transforms light emitted from the light emitting module 1060 to planar light, and performs diffusion, light focusing, and the like.

Figure 18:
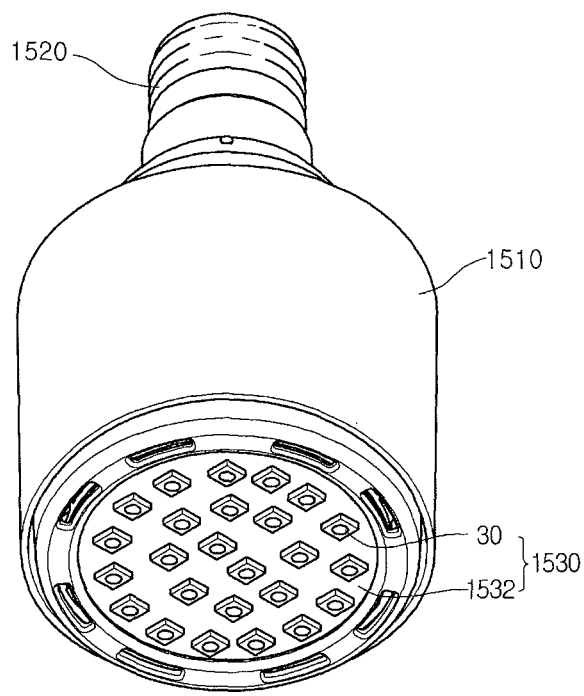
FIG. 18 is a perspective view of a lighting unit provided with the light emitting device.

FIG. 18 is a perspective view of a lighting unit according to an embodiment.

Referring to FIG. 18, the lighting unit 1500 may include a case 1510, a light emitting module 1530 equipped in the case 1510, and a connection terminal 1520 equipped in the case 1510 and supplied with an electric power from an external power supply.

The case 1510 may be preferably formed of a material having good heat shielding characteristics, for example, a metal material or a resin material.

The light emitting module 1530 may include a board 1532, and at least one light emitting device package 30 according to the embodiments mounted on the board 1532. The light emitting device package 30 may include a plurality of light emitting device packages which are arrayed apart by a predetermined distance from one another in a matrix configuration.

The board 1532 may be an insulator substrate on which a circuit pattern is printed, and may include, for example, a printed circuit board (PCB), a metal core PCB, a flexible PCB, a ceramic PCB, an FR-4 substrate, etc.

Also, the board 1532 may be formed of a material to efficiently reflect light, and a surface thereof may be formed in a color capable of efficiently reflecting light, for example, white color, or silver color.

The at least one light emitting device packages 30 may be mounted on the board 1532. Each of the light emitting device packages 30 may include at least one light emitting diode (LED) chip. The LED chip may include a color LED emitting red, green, blue or white light, and a UV LED emitting ultra-violet (UV).

The light emitting module 1530 may have a combination of various light emitting device packages so as to obtain desired color and luminance. For example, the light emitting module 1530 may have a combination of a white LED, a red LED, and a green LED so as to obtain a high color rendering index (CRI).

The connection terminal 1520 may be electrically connected to the light emitting module 1530 to supply power. The connection terminal 1520 may be screwed and coupled to an external power in a socket type, but the present disclosure is not limited thereto. For example, the connection terminal 1520 may be made in a pin type and inserted into an external power, or may be connected to the external power through a power line.

According to the embodiment, the light emitting device packages including the light emitting device 100 are arranged on the substrate to form the light emitting module. In addition, the light emitting devices as shown in FIG. 1 are arranged on the substrate and then packaged to form the light emitting module.

A method of manufacturing a light emitting device according to the embodiment includes steps of forming a plurality of compound semiconductor layers, which includes a first conductive semiconductor layer, an active layer, and a second conductive semiconductor layer, on a substrate; forming a protective layer in a channel region of the compound semiconductor layers; forming a buffer layer electrically connected with the second conductive semiconductor layer in the channel region of the compound semiconductor layers; forming a reflective layer on the compound semiconductor layers; providing the reflective layer at a base to remove the substrate; etching the channel region of the compound semiconductor layers to expose the protective layer and the buffer layer; and forming an electrode on the compound semiconductor layer.

As described above, according to the embodiment, the damage of the protective layer can be prevented, an adhesion problem between layers in the channel region of the chip can be solved, delamination problem between metal and non-metal in the manufacturing process for the channel region of the chip can be solved, and the damage of the protective layer of the chip can be prevented. Accordingly, the reliability for the light emitting device can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device comprising: a light emitting structure including a first conductive semiconductor layer, a second conductive semiconductor layer under the first conductive semiconductor layer, and an active layer between the first and second conductive semiconductor layers;
   an electrode connected to the first conductive semiconductor layer;
   a first conductive layer disposed under the second conductive semiconductor layer;
   a second conductive layer disposed under the first conductive layer;
   a protective layer disposed on an outer portion of a lower surface of the second conductive semiconductor layer and disposed outward further than the first conductive layer; and
   a third conductive layer disposed under the second conductive layer and the protective layer;
   a support member disposed under the third conductive layer; and
   a buffer layer disposed between the protective layer and the third conductive layer and includes a metallic material,
   wherein the protective layer includes a first opening, a first portion contacted with the lower surface of the second conductive semiconductor layer, and a second portion disposed outwardly further than the first portion,
   wherein the first conductive layer is disposed in the first opening of the protective layer,
   wherein the second portion of the protective layer and the buffer layer is overlapped with the third conductive layer in a vertical direction, and
   wherein the buffer layer is disposed outwardly further than a lateral surface of the first conductive layer; and
   wherein the protective layer has a thickness of 0.02 μm to 5 μm,
   wherein the buffer layer has a thickness thinner than a thickness of the protective layer or has a thickness in a range of 1 μm to 10 μm.

2. The semiconductor light emitting device of claim 1, wherein the buffer layer includes a second opening and a portion of the third conductive layer is disposed in the second opening.

3. The semiconductor light emitting device of claim 2, wherein the second opening has a width wider than that of the first opening.

4. The semiconductor light emitting device of claim 2, wherein the buffer layer is formed of a different material from the first and second conductive layers.

5. The semiconductor light emitting device of claim 2, wherein the support member is formed of a metal and is overlapped with the buffer layer and the protective layer in the vertical direction.

6. The semiconductor light emitting device of claim 1, further comprising an insulating layer contacted with a lateral surface of the light emitting structure.

7. The semiconductor light emitting device of claim 6, wherein the insulating layer contacts a top surface of the protective layer and a top surface of the first conductive semiconductor layer.

8. The semiconductor light emitting device of claim 6, wherein the buffer layer contacts the protective layer and the third conducive layer.

9. The semiconductor light emitting device of claim 1, wherein the protective layer includes a transmissive material.

10. A semiconductor light emitting device comprising: a light emitting structure including a first conductive semiconductor layer, a second conductive semiconductor layer under the first conductive semiconductor layer, and an active layer between the first and second conductive semiconductor layers;
    an electrode connected to the first conductive semiconductor layer;
    a first conductive layer disposed under the second conductive semiconductor layer;
    a second conductive layer disposed under the first conductive layer; a protective layer disposed on an outer portion of a lower surface of the second conductive semiconductor layer and disposed outward further than the first conductive layer; and
    a third conductive layer disposed under the second conductive layer and the protective layer;
    a support member disposed under the third conductive layer; and
    a first buffer layer disposed between the protective layer and the third conductive layer,
    wherein the protective layer includes a first opening, a first portion contacted with the lower surface of the second conductive semiconductor layer, and a second portion disposed outwardly further than the first portion,
    wherein the first conductive layer is disposed in the first opening of the protective layer,
    wherein the second portion of the protective layer and the first buffer layer is overlapped with the third conductive layer in a vertical direction, and
    wherein the first buffer layer is disposed outwardly further than a lateral surfaces of the first and second conductive layers; and
    wherein the protective layer has a thickness of 0.02 µm to 5 µm,
    wherein the buffer layer has a thickness thinner than a thickness of the protective layer or has a thickness in a range of 1 µm to 10 µm.

11. The semiconductor light emitting device of claim 10, wherein the first buffer layer contacts the protective layer and the third conductive layer.

12. The semiconductor light emitting device of claim 11, wherein the first buffer layer includes a different material from the second and third conductive layers,
    wherein the second conductive layer is a reflective layer.

13. The semiconductor light emitting device of claim 12, wherein the protective layer is disposed around the first and second conductive layers.

14. The semiconductor light emitting device of claim 10, wherein the protective layer includes a transmissive material and the support member includes a metal.

15. The semiconductor light emitting device of claim 10, further comprising a second buffer layer disposed on a top surface of the protective layer and overlapped with the first buffer layer.

16. The semiconductor light emitting device of claim 15, wherein the second buffer layer is disposed outwardly further than the first and second conductive layers and the first buffer layer is spaced apart from the first and second conductive layers.

17. The semiconductor light emitting device of claim 10, further comprising an insulating layer contacted with a lateral surface of the light emitting structure and a top surface of the protective layer,
    wherein the support member has a width wider that of the second conductive semiconductor layer and includes an outer region overlapped with the first buffer layer.

18. A semiconductor light emitting device comprising: a light emitting structure including a first conductive semiconductor layer, a second conductive semiconductor layer under the first conductive semiconductor layer, and an active layer between the first and second conductive semiconductor layers;
    an electrode connected to the first conductive semiconductor layer;
    a conductive layer contact a lower surface of the second conductive semiconductor layer;
    a reflective electrode layer disposed under the contact layer;
    a protective layer disposed on an outer portion of the lower surface of the second conductive semiconductor layer and disposed outward further than the first conductive layer; and
    a conductive adhesion layer disposed under the reflective electrode layer and the protective layer;
    a conductive support member disposed under the conductive adhesion layer; and
    a buffer layer disposed between the protective layer and the conductive adhesion layer,
    wherein the protective layer includes a first opening, a first portion contacted with the lower surface of the second conductive semiconductor layer, and a second portion disposed outwardly further than the first portion,
    wherein the conductive contact layer is disposed in the first opening of the protective layer,
    wherein the second portion of the protective layer and the buffer layer is overlapped with the conductive adhesion layer in a vertical direction,
    wherein the buffer layer is disposed outwardly further than a lateral surfaces of the conductive contact layer and the reflective electrode layer, and
    wherein the buffer layer includes a different material from the reflective electrode layer; and
    wherein the protective layer has a thickness of 0.02 µm to 5 µm,
    wherein the buffer layer has a thickness thinner than a thickness of the protective layer or has a thickness in a range of 1 µm to 10 µm.

19. The semiconductor light emitting device of claim 18, wherein the buffer layer is located at a lower position than a bottom surface of the reflective electrode layer.

* * * * *